US007217499B2

(12) United States Patent
Ozaki et al.

(10) Patent No.: US 7,217,499 B2
(45) Date of Patent: May 15, 2007

(54) ALUMINUM SUPPORT FOR LITHOGRAPHIC PRINTING PLATE AND BASE PLATE FOR LITHOGRAPHIC PRINTING PLATE

(75) Inventors: Jun Ozaki, Warabi (JP); Yasuhiro Uozumi, Warabi (JP)

(73) Assignee: Okamoto Chemical Industry Co., Ltd., Saitama-ken (JP)

( * ) Notice: Subject to any disclaimer, the term of this patent is extended or adjusted under 35 U.S.C. 154(b) by 0 days.

(21) Appl. No.: 11/017,102

(22) Filed: Dec. 21, 2004

(65) Prior Publication Data

US 2005/0142493 A1 Jun. 30, 2005

(30) Foreign Application Priority Data

Dec. 26, 2003 (JP) ............................ 2003-433648
Nov. 26, 2004 (JP) ............................ 2004-341331

(51) Int. Cl.
*G03F 7/09* (2006.01)

(52) U.S. Cl. .................................... 430/278.1; 430/302

(58) Field of Classification Search ............. 430/278.1, 430/302

See application file for complete search history.

(56) References Cited

U.S. PATENT DOCUMENTS

| | | | | |
|---|---|---|---|---|
| 4,123,279 | A | 10/1978 | Kobayashi | |
| 4,238,279 | A * | 12/1980 | Tsubai et al. | 216/108 |
| 5,891,269 | A | 4/1999 | Koerner et al. | |
| 6,468,717 | B2 * | 10/2002 | Kita et al. | 430/278.1 |
| 6,983,694 | B2 * | 1/2006 | Vermeersch et al. | 101/459 |
| 7,026,096 | B2 * | 4/2006 | Hotta | 430/278.1 |
| 2002/0182538 | A1 | 12/2002 | Tomita et al. | |
| 2004/0131967 | A1 | 7/2004 | Ozaki | |

FOREIGN PATENT DOCUMENTS

| | | | |
|---|---|---|---|
| JP | 50-125806 | A | 10/1975 |
| JP | 59-121044 | A | 7/1984 |
| JP | 60-088942 | A | 5/1985 |
| JP | 62-251740 | A | 11/1987 |
| JP | 02-096755 | A | 4/1990 |
| JP | 04-013149 | A | 1/1992 |
| JP | 10-297130 | A | 11/1998 |
| JP | 2000-15948 | A | 1/2000 |
| JP | 2002-080481 | A | 3/2002 |
| JP | 2002-116549 | A | 4/2002 |
| JP | 2004-212752 | A | 7/2004 |

* cited by examiner

*Primary Examiner*—Barbara L. Gilliam
(74) *Attorney, Agent, or Firm*—Foley & Lardner LLP

(57) ABSTRACT

An object of the present invention is to provide a support for lithographic printing plates provided with a photosensitive layer containing an acid generator and an acid-decomposable compound, that offers superior sensitivity, chemical resistance, print durability, and little scumming during printing. The present invention provides an aluminum support for a lithographic printing plate, the support being obtainable by treating a surface of an anodized aluminum plate with a treatment liquid comprising metal fluoride, metal phosphate salt, and perchlorate, and a base plate for a lithographic printing plate using the same.

4 Claims, No Drawings

ALUMINUM SUPPORT FOR LITHOGRAPHIC PRINTING PLATE AND BASE PLATE FOR LITHOGRAPHIC PRINTING PLATE

BACKGROUND OF THE INVENTION

1. Field of the Invention

The present invention relates to aluminum supports for lithographic printing plates and base plates for lithographic printing plates using the same. In particular, it relates to the aluminum supports suitable for so-called direct plate-making positive-type lithographic printing plates, which can be used for direct plate-making by receiving digital signals from a computer or the like.

2. Description of Related Art

Conventionally, positive-type photosensitive lithographic printing plates have a photosensitive layer component mainly comprising an O-quinone diazide compound and a binder resin such as a novolac resin, wherein the exposure of ultraviolet light leads to photodecomposition at the exposure areas and increase of solubility to developing liquids, and utilizing these characteristics, non-image areas are formed by removing the exposed areas with a developer, and non-exposed areas form the image area. These plates are commonly referred to as conventional PS plates.

Furthermore, lithographic printing plates utilizing a direct plate-making method (thermal positive) and the like have been developed, that have a photosensitive layer component mainly comprising a photothermal conversion material such as an infrared absorbing pigment, which absorbs infrared light and converts it to heat, and a binder resin such as novolac resin, wherein images are formed by altering the structure of the resin by using infrared laser exposure, and increasing solubility to developing liquids.

Regarding such lithographic printing plate materials that use infrared lasers as their exposure light source, since the energy of the infrared light used for writing is lower than that of the ultraviolet light used for conventional exposure light sources, in comparison with conventional PS plates, the gap in the speed of dissolution between exposed areas and non-exposed areas is narrower, and changes in usage conditions often cause over-exposure and development deficiencies. Also, it is difficult to dissolve those parts of the photosensitive layer that have sunk into the pores of the anodic oxidation coating of the anodized aluminum support, and this results in scumming and other problems.

In this regard, for example, Japanese Patent Application Unexamined Publication No. H10-297130 A discloses an aluminum support for lithographic printing plates having particles of 5 μm or smaller on its surface, but although such a support is effective for conventional PS plates, this sometimes makes it easy for problems such as scumming to occur with thermal positive plates, which have a small development latitude.

Furthermore, Japanese Patent Application Unexamined Publication No. 2002-116549 A teaches a base plate for a lithographic printing plate having on a support with a coating layer containing an inorganic fluorine compound and a phosphorus compound, a photosensitive layer containing a high molecular compound whose solubility in alkaline solutions is varied by heat and a material which absorbs light and generates heat. However, there are problems with such supports in regard to a photosensitive layer containing a photoacid generator and an acid-decomposable compound, such as a tendency for portions of the film of the photosensitive layer to become residual, as well as worsening of chemical resistance against dampening solutions, plate cleaners and the like, and lower print durability.

SUMMARY OF THE INVENTION

Consequently, an object of the present invention is to provide a support for lithographic printing plates comprising a photosensitive layer containing an acid generator and an acid-decomposable compound, so that the plate can offer superior sensitivity, chemical resistance, print durability, and little scumming during printing.

As a result of intensive research, the present inventors found a way to achieve the above-described object, wherein a particle of a mean particle size not greater than 1 μm is formed on the surface of an anodic oxidation coating of an anodized aluminum plate by treating the plate with a treatment liquid containing metal fluoride, metal phosphate salt, and perchlorate, and wherein on this is applied a photosensitive layer containing a acid generator and an acid-decomposable compound, thus resulting in the completion of the present invention.

Specifically, in one aspect of the present invention, there is provided an aluminum support for a lithographic printing plate, the support being obtainable by treating a surface of an anodized aluminum plate with a treatment liquid comprising metal fluoride, metal phosphate salt, and perchlorate. Preferably, the aluminum support comprises particles, produced by said treating, of a mean particle size not greater than 1 μm on said surface.

Furthermore, in another aspect of the present invention, there is provided a base plate for a lithographic printing plate, the base plate comprising the above-mentioned aluminum support, and a photosensitive layer for infrared laser on the aluminum support, wherein the photosensitive layer comprises:

(A) an acid-decomposable compound obtainable by the addition reaction of a resinous polymer having one or more phenolic hydroxyl groups with a silane coupling agent of the following general formula (1) or (2), (1)

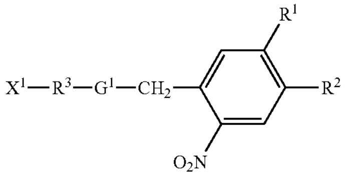

(2)

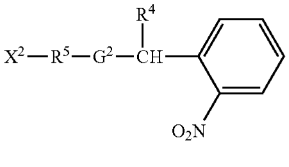

wherein $X^1$ represents a trimethoxysilyl or triethoxysilyl group; $G^1$ represents O or COO; $R^1$ and $R^2$ each independently represents a hydrogen atom or a methoxy group, but both of them are not hydrogen atoms at the same time; $R^1$ and $R^2$ may also be combined together to form a ring through an alkylenedioxy group; $R^3$ represents $(CH_2)_m$ which may have a hydrocarbon side chain, wherein m is an integer of 3 or greater; $X^2$ represents a trimethoxysilyl, triethoxysilyl, chlorodimethylsilyl, dichloromethylsilyl or trichlorosilyl group; $G^2$ represents O or COO; $R^4$ represents a hydrogen atom or a straight-chain or branched alkyl group; and $R^5$ represents $(CH_2)_n$ which may have a hydrocarbon side chain, wherein n is an integer of 3 or greater;

(B) an acid generator;

(C) an infrared absorber; and (D) an alkali-soluble resin.

As will be described in detail below, an aluminum support for a lithographic printing plate or a lithographic printing plate base plate according to the present invention can offer a lithographic printing plate for infrared laser in which there is little soiling and no blanket soiling during printing with respect to non-image areas, and which has superior sensitivity, chemical resistance, and print durability with respect to image areas.

DETAILED DESCRIPTION OF PREFERRED EMBODIMENTS

The following is a description of embodiments of the present invention. The present invention is in no way limited to these embodiments as described below. With the present invention, it is possible to provide extremely fine particles of a mean particle size not greater than 1 μm on the surface of an anodic oxidation coating of an anodized aluminum plate, produced by treating the plate with a treatment liquid containing metal fluoride, metal phosphate salt, and perchlorate. This improves the development removal properties of the base plate for a lithographic printing plate. This is thought, but not particularly limited, to be because the particles cover the surface of pores made by anodization, and this prevents the photosensitive layer from sinking into the pores, thus quickening the development properties.

Furthermore, the present invention also has superior effectiveness with regard to an ink insensitive effect in non-image areas for (infrared laser) thermal positive printing plates in particular, and thus eliminates blanket soiling during printing. This is thought, but not particularly limited, to be because the particles formed on the anodic oxidation coating is comprises fluorine and phosphorus molecules, although its structure is not entirely clear, and therefore possesses ink repelling properties.

The aluminum plate used in the present invention is a plate-shaped member such as a pure aluminum plate that comprises aluminum as a main constituent or an aluminum alloy that contains a small amount of other elements. Such other elements include, but not limited to, silicon, iron, copper, manganese, magnesium, nickel, zinc, and titanium. There is no particular limitation to the aluminum plate that can be applied in the present invention, and aluminum plates of conventionally known compositions can be used as appropriate. The thickness of the aluminum plate used in the present invention is preferably in the range of approximately 0.1 to 0.5 mm.

It is preferable that the method of manufacturing the aluminum support comprises a step of degreasing the aluminum plate. This is in order to remove oil components such as those used when rolling the aluminum plate. The degreasing method can be carried out using a surface active agent on the surface of the aluminum plate or an aqueous alkaline solution.

Furthermore, it is preferable that the method of manufacturing the aluminum support comprises a step of roughening the surface of the aluminum plate (or an aluminum plate that has been degreased). There is no particular limitation to the method of surface roughening, and various known methods can be used. For example, there are methods of mechanical surface roughening, methods of electrochemical surface roughening, and methods of surface roughening combining both of these. Any known method, such as brush polishing, ball polishing, blast polishing, and buff polishing, can be used as a mechanical method. Furthermore, electrochemical surface roughening methods include methods using an alternating current or a direct current in an electrolytic solution of hydrochloric acid or nitric acid.

It is preferable that the method of manufacturing the aluminum support includes a step of etching the aluminum plate, which has undergone surface roughening, in an aqueous alkaline solution. An alkaline agent that can be used in alkaline etching may include, but not limited to, sodium hydroxide, potassium hydroxide, tertiary sodium phosphate, tertiary potassium phosphate, sodium aluminate, sodium carbonate, sodium meta-silicic acid, sodium orthosilicate, and sodium gluconic acid. It may be used as a solution of one or more thereof. There is no particular limitation, but it is preferable that the concentration of the alkaline etching solution is 1 to 60 wt %, and it is preferable that etching is performed in a temperature in the range of 30 to 100° C. with a treating period in the range of 2 to 60 seconds for etching of 0.5 to 13 $g/m^2$. An etching method may include methods such as immersing the aluminum plate in an etching solution and methods in which the etching solution is applied by a spray or a nozzle.

There is no particular limitation, but it is preferable that the method of manufacturing the aluminum support comprises a step of de-smutting the etched aluminum plate. After the above-described alkaline etching has been performed, de-smutting can be carried out as required either by de-smutting with nitric acid, phosphoric acid, or sulfuric acid or a mixed acid containing two or more of these, or by simply rinsing, or in some cases, by high-pressure rinsing.

It is preferable that the method of manufacturing the aluminum support includes a step of anodizing the etched aluminum plate (or the de-smutted aluminum plate). Electrolytes that are used in anodization generally include, but not limited to, sulfuric acid, phosphoric acid, oxalic acid, chromic acid, or mixtures thereof. As the conditions for performing anodization vary depending on the electrolyte used, the conditions cannot be specified absolutely, but it is generally suitable that the concentration of the electrolyte is in the range of 1 to 50 wt % of the solution, with a liquid temperature in the range of 5 to 45° C., an electric current density in the range of 1 to 40 $A/dm^2$, a voltage in the range of 5 to 50 V, and a treatment time in the range of 5 seconds to 10 minutes.

An anodic oxidation coating is formed by anodization on the surface of the aluminum plate, and it is preferable that the amount of anodic oxidation coating is at least 0.5 $g/m^2$, and more preferably in the range of 1.0 to 4.0 $g/m^2$. It is preferable when the anodic oxidation coating is at least 0.5 $g/m^2$ because it becomes very difficult to scratch the surface of the plate, and it is difficult for soiling to occur during printing by ink adhering to a scratched portion. Conversely, it is preferable when the anodic oxidation coating is at most 4.0 $g/m^2$ since the speed of development becomes faster and sensitivity is improved.

Furthermore, the method of manufacturing the aluminum support comprises a step of treating a surface of the anodized aluminum plate with a treatment liquid comprising metal fluoride, metal phosphate salt, and perchlorate. With this step, it is possible to provide particles of a mean particle size not greater than 1 μm on the anodic oxidation coating on the surface of an aluminum plate, with substantially no etching of the anodic oxidation coating and, moreover, without altering the cell shape of the anodic oxidation coating, by treating the anodized aluminum plate with a treatment liquid, preferably an aqueous solution, containing metal fluoride, metal phosphate salt, and perchlorate. Furthermore, with this step, it is preferable to provide the particles of a mean particle size not greater than 1 μm with, for example, a round shape and/or a scale shape trough to surface areas of the jagged protruding shape of the particles of the aluminum surface, or the pores formed by electrolytic polishing. Occasionally, a greater portion of the product will appear to have a round shape and/or a scale shape, but within this there may be portions wherein the round shapes are collapsed and angular crystalline shapes are evident.

Here, there is no particular limitation, but "substantially no etching of the anodic oxidation coating" means that the amount of anodic oxidation coating after treatment is preferably at least 0.5 $g/m^2$, and more preferably in the range of 1.0 to 4.0 $g/m^2$. It is preferable when there is substantially no etching of the anodic oxidation coating because this helps to prevent scratching in non-image areas and does not adversely affect print durability. Furthermore, although there is no particular limitation, "without altering the cell shape of the anodic oxidation coating" means that, after treatment, the anodic oxidation coating has the hexagonal cell structure cells that an anodic oxidation coating generally has. It is preferable when there is no alteration of the cell shape of the anodic oxidation coating because of surface uniformity and water retention.

As for the particles, although it varies depending on treatment conditions, it is preferable that 20%, or more preferably in the range of 30 to 100%, of the surface of the anodic oxidation coating is covered with the particles. It is preferable when the coverage rate of the product is at least 20% since the speed of development is faster and there is better ink insensitivity during printing. Furthermore, it is preferable that the mean particle size is not more than 1 μm, and more preferably in the range of 0.001 to 0.8 μm. When the mean particle size is at least 0.001 μm, the development removal properties are better, and blanket soiling during printing is inhibited, which is preferable. Conversely, when the mean particle size is not greater than 1 μm, blanket soiling is still similarly inhibited and development removal properties are better, and the risk that ink will sink in between the particles and cause soiling during printing is reduced, which is preferable. These surface conditions can be observed using a high magnification optical microscope or a scanning electron microscope.

When a photosensitive layer is applied to particles arranged in this way, the particles stick to the photosensitive layer and print durability is improved, and perhaps because the developing liquid penetrates in between the particles well during development, development can be carried out smoothly, and the photosensitive layer can be developed cleanly, and therefore the tone contrast of the image is improved, and, in the non-image areas, there is no soiling caused by residual developing liquid, and even when the non-image areas are rubbed with a removal liquid, no residue comes out and there is no soiling. Furthermore, since the particles cover the anodic oxidation coating and the pores of anodization, no dye or photosensitive layer is absorbed into the anodic oxidation coating, and since dyes and the like are prevented from sinking into the pores, no color is left on the non-image areas. The effect of the particles during printing are that dampening solution can penetrate between the particles to improve water retention so that printing can be achieved with a small amount of dampening solution, and therefore high quality printing is achieved.

A further different effect is that, since the surface is covered with the particles, sponge debris is inhibited from adhering when rubbing the surface with a slippery, water-filled sponge used in proofing and the like and, furthermore, the reflectivity of the surface is reduced due to the particles, which has the effect of preventing halation, thus enabling superior halftone reproduction without dot reduction.

Metal fluoride that can be suitably applied in the above-described treatment liquid may include, but not limited to, sodium fluoride, potassium fluoride, sodium acid fluoride, potassium acid fluoride, calcium fluoride, magnesium fluoride, barium fluoride, chromium fluoride, lithium fluoride, manganese fluoride, hexafluoro zirconium potassium, hexafluoro zirconium sodium, hexafluoro potassium titanate, hexafluoro zirconium ammonium, hexafluoro ammonium titanate, nickel fluoride, iron fluoride, and titanium fluoride, and it is possible to use a single one of these, but it is also possible to use combinations of two or more of these. Of these, sodium fluoride, potassium fluoride, sodium acid fluoride, and potassium acid fluoride are preferable in particular. Metal fluorides are preferable, since, within a certain range of concentration, they have substantially no etching effect on the surface of a metallic oxide coating.

There is no particular limitation, but the concentration of the metal fluoride is preferably in the range of 0.1 to 40 wt %, or more preferably in the range of 0.2 to 30 wt %. At least 0.1 wt % is preferable since this makes it easier to form the particles and to favorably obtain the targeted effect of the present invention. And at most 40 wt % is preferable since a favorable particle size of the particles can be obtained and there is no over etching of the aluminum plate.

The metallic phosphate salt that can be suitably used in the treatment liquid may include, but not limited to, alkali metal phosphate salts and metal phosphates such as alkali earth metal phosphate salts. Specific examples include zinc phosphate, aluminum phosphate, potassium dihydrogenphosphate, dipotassium hydrogenphosphate, calcium phosphate, magnesium phosphate, magnesium hydrogenphosphate, ferrous phosphate, ferric phosphate, sodium dihydrogenphosphate, disodium potassium phosphate, lead phosphate, calcium hydrogenphosphate, lithium phosphate, tungstophosphoric acid, and potassium tungstophosphoric acid. Further examples include sodium phosphite, sodium tripolyphosphate, and sodium pyrophosphate. In the present invention, it is possible to use these individually, and it is also possible to use combinations of two or more of these. Of these, disodium hydrogenphosphate, sodium dihydrogenphosphate, dipotassium hydrogenphosphate, and potassium dihydrogen phosphate are preferable in particular.

The concentration of the metal phosphate salt is preferably in the range of 1.0 to 50 wt %, and more preferably in the range of 2.0 to 40 wt %. Water retention and ink insensitivity are better when at least 0.1 wt %, and print durability is better when at most 50 wt %, which is preferable.

A perchlorate is added to the above-described treatment liquid here in order to make it easier to form fine particles of a mean particle size not greater than 1 μm on the surface of the anodized aluminum. There is no particular limitation and no certain theory can be offered, but it is thought that adding perchlorate to the treatment liquid produces a slight etching effect that makes the particles themselves smaller, thus making it easier to form fine particles.

Furthermore, by providing fine particles in this way, it is possible to inhibit side etching of the halftone dots and line art on them, and resistance against dampening solution and chemicals such as plate cleaners is increased, thus improving print durability.

perchlorates that can be suitably used in the treatment liquid include, but not limited to, zinc perchlorate, ammonium perchlorate, potassium perchlorate, iron perchlorate, sodium perchlorate, nickel perchlorate, barium perchlorate, magnesium perchlorate, and lithium perchlorate. In the present invention, it is possible to use these individually, and it is also possible to use combinations of two or more of these. Of these, ammonium perchlorate, potassium perchlorate and sodium perchlorate are preferable in particular.

The concentration of perchlorate in the treatment liquid is preferably in the range of 0.01 to 30 wt %, and more preferably in the range of 0.1 to 20 wt %. Fine particles can be more easily formed when it is at least 0.01 wt %, and the formation of the particles is better when it is at most 30 wt %, which is preferable.

The treatment liquid can also contain other mixtures that do not hinder the formation of the particles and do not etch the aluminum plate. For example, sulfuric acid, nitric acid, hydrochloric acid, phosphoric acid, and acetic acid, as well as aluminum salts, ammonium salts, sodium salts, potassium salts, calcium salts, zinc salts, magnesium salts, and lithium salts of these. Further examples include oxalic acids, tannic acids, alums, chrome alums, boric acids, chromic anhydrides, and chromate salts. These may be used individually or in combinations of two or more. Furthermore, silica metal salts, surface active agents, scale inhibitors, water soluble resins, emulsified water insoluble substances, halation prevention dyes, pigments, and organic solvents may also be added.

As for the concentration in relation to the adding of the above-mentioned substances, it is preferable that it is less than 1.0 wt % for strong acids such as sulfuric acid, nitric acid, hydrochloric acid, phosphoric acid, and acetic acid. There is no excessive etching of the anodic oxidation coating of the surface when this concentration is less than 1.0 wt %, which is preferable. For the other mixtures listed above, it is preferable that this concentration is less than 50 wt %. This achieves good dissolving and good particle formation without excessive etching of the anodic oxidation coating of the surface, which is preferable.

There is no particular limitation to the method of treating the surface with this treatment liquid, and any known method can be used. There is no limitation in particular, but an immersion method, a dispersion method, a spraying method, or a coating method can be suitably used to carry out surface treatment. It is preferable that the treatment temperature is in the range of 10 to 80° C. and the treatment time to be in the range of 1 to 60 seconds, and it is preferable the pH is in the range of 1.0 to 6.5. It is also possible to apply an electrical current of a direct current or an alternating current to the treatment liquid while such treatment is being preformed, and it is also possible to treat the aluminum plate in the same manner as anodization. The treatment time can be reduced by applying an electrical current in this way.

There is no particular limitation, but it is preferable that the method of manufacturing the aluminum support comprises a step of washing the surface-treated aluminum plate. The washing treatment can be carried out by water washing, but it is preferable that no particle is removed by the washing treatment. For this reason, water washing with high pressure water washing or brushing, for example, is not preferable.

An aluminum plate that undergoes such a washing treatment can be used as it is as a support for a lithographic printing plate, but further surface treatment may be performed depending on requirements. Specific examples of suitable surface treatments include treatment with sulfuric acid, nitric acid, phosphoric acid, boric acid, chromic acid, or silicic acid, or with ammonium salts of these, or with an aqueous solution of an alkali metal salt. Further examples include treatments that involve providing an undercoat layer that contains a water soluble compound such as polyacrylic acid, polyvinyl alcohol, polyvinyl phosphonic acid, polyvinyl pyrrolidone, carboxymethyl-cellulose, dextrin, or starch, and treatments that involve undercoating with a halation prevention dye or pigment. However, in the case of using any of these, treatment methods or conditions are not appropriate that involve dissolving or removing the particles that adhere to the surface of the aluminum support.

Furthermore, it is possible to carry out treatments that make the particles adhere more strongly to the aluminum plate, such as treatment with hot water and/or hot air at not less than 50° C., or steam treatment.

It is preferable that the photosensitive layer applied in the present invention is a photosensitive layer that contains an acid generator and a photodecomposition compound, or more preferably a positive type photosensitive layer for infrared lasers. However, there is no limitation to these for the photosensitive layer applied in the present invention, and it is also possible to use a negative type photosensitive layer for infrared lasers, a photopolymerization type photosensitive layer that contains an ethylenic unsaturated compound, a photocrosslinked type photosensitive layer provided with a cinnamic acid or a dimethylmaleimide group, a photosensitive layer provided with a physical development nuclear layer and a silver halide emulsion layer, a photosensitive layer for conventional positive type PS plates that contains a quinone diazide compound, and a photosensitive layer for conventional positive type PS plates that contains a diazo resin.

There is no particular limitation, but it is preferable that the positive type photosensitive layer for infrared lasers comprises:

(A) an acid-decomposable compound obtainable by the addition reaction of a resinous polymer having one or more phenolic hydroxyl groups with a silane coupling agent of the above general formula (1) or (2), (B) an acid generator;

(C) an infrared absorber; and (D) an alkali-soluble resin.

Each component of the photosensitive layer which can be used for the present invention will be described in detail below.

According to our findings, it is believed that the acid-decomposable compound of the present invention provides an photosensitive layer having excellent characteristics on the basis of the following mechanism. That is, when the photosensitive layer is irradiated with infrared radiation as from a semiconductor laser, the infrared absorber absorbs this radiation and instantaneously produces heat, for example, of several hundred degrees. Owing to the heat so produced and the like, the acid generator is decomposed to generate an acid. The acid so generated causes the acid-decomposable compound to decompose at the silyl group and thereby produce a polymer having one or more phenolic hydroxyl groups and a silanol compound. There is a possibility that heat may also contribute to the decomposition of the acid-decomposable compound. The polymer having one or more phenolic hydroxyl groups and the silanol compound, which are produced as a result of the decomposition, are both highly soluble in an alkaline developing solution or the like. On the other hand, owing to the addition of such a polymeric compound, the unexposed region has high alkali resistance and is hardly attacked by the developing solution. Consequently, the acid-decomposable compound of the present invention makes it possible to provide an photosensitive layer which exhibits a great difference in solubility in an alkaline developing solution or the like between exposed and unexposed regions, and very excellent stability to the developing solution (great latitude of development). Moreover, the acid-decomposable compound of the present invention gives good ink adhesion and the image-forming composition of the present invention has excellent printing durability.

The acid-decomposable compound used in the present invention can be synthesized by an addition reaction of a resinous polymer having one or more phenolic hydroxyl groups, with a silane coupling agent represented by the above general formula (1) or (2). This reaction is preferably carried out under the following conditions. As the solvent, it is preferable to use hexane, cyclohexane, benzene or the like. The amount of solvent used is preferably in the range of 10 to 200 g per gram of the resinous polymer. The aforesaid silane coupling agent is preferably used in an amount of 0.5 to 100 moles per mole of the hydroxyl groups possessed by the resinous polymer. It is believed that, owing to steric factors and the like, the amount of the silane coupling agent does not depend on the numbers of the reactive groups ($OCH_3$, $OC_2H_5$ and Cl) attached to the silicon. The reaction temperature is preferably in the range of 50 to 150° C. The resulting acid-decomposable compound may be purified, for example, by distilling off the solvent.

The weight-average molecular weight of the acid-decomposable compound is preferably not less than 1,000 and more preferably in the range of 1,500 to 300,000. Generally, the acid-decomposable compound is characterized in that it absorbs ultraviolet radiation having a wavelength, for example, in the range of 200 to 450 nm and it decomposes at $G^1$ or $G^2$.

In this addition reaction of the resinous polymer with the silane coupling agent, the $OCH_3$, $OC_2H_5$ and Cl attached to the silicon in the $X^1$ or $X^2$ of the silane coupling agent are stable in an anhydrous state, but may be hydrolyzed to OH in the presence of water contained naturally in the solvent. As a result of this addition reaction with the silane coupling agent, there is obtained, for example, a compound represented by the following formula (I) or (II). In these formulae, Polym-OH represents a resinous polymer having one or more phenolic hydroxyl groups. $R^6$ and $R^7$ each independently represents a hydrogen atom, a methyl group or an ethyl group, and $R^8$ and $R^9$ each independently represents a methyl group, a hydroxyl group or a chlorine atom.

(I)

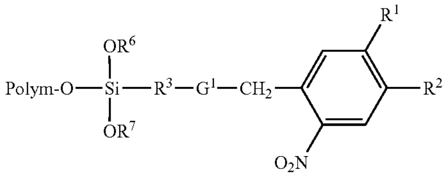

-continued (II)

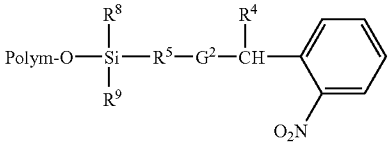

Where the silicon of this silane coupling agent has a plurality of reactive groups ($OCH_3$, $OC_2H_5$ or Cl), there is a possibility that the silane coupling agent will react with a plurality of phenolic hydroxyl groups. However, this is thought to be rare. Moreover, the self-condensation of the silane coupling agent is also possible. However, it is believed that this is minimized, for example, by the steric hindrance of the nitro group attached to the benzene ring.

The compounds of the above general formulae (1) and (2) preferably include compounds represented by the following general formulae (1ET), (1ES), (2ET) and (2ES).

(1ET)

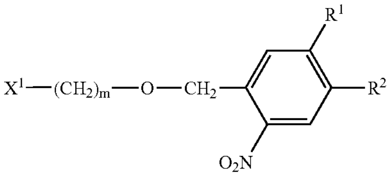

(1ES)

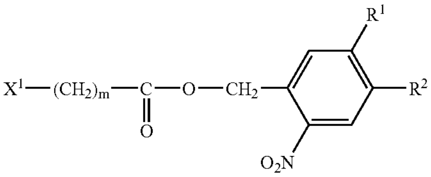

(2ET)

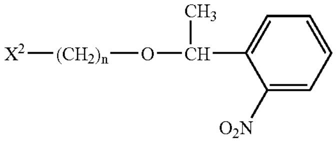

(2ES)

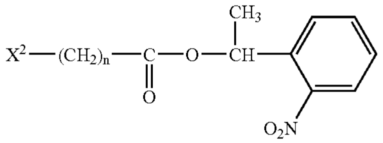

In the above formulae, $X^1$ represents a trimethoxysilyl or triethoxysilyl group; $X^2$ represents a trimethoxysilyl, triethoxysilyl, chlorodimethylsilyl, dichloromethylsilyl or trichlorosilyl group; and m and n each independently represents an integer of 3 or greater. m is preferably from 3 to 15 and more preferably from 3 to 10. n is preferably from 3 to 15 and more preferably from 3 to 10. The $(CH_2)_m$ or $(CH_2)_n$ may have one or more hydrocarbon side chains. For the convenience of synthesis, the side chains are preferably located on a carbon atom on the methylene chain that is separated by one or more carbon atoms from the carbon atom to which $X^1$ or $X^2$ is attached. For example, in $X^1—C_a—C_b—C_c—$, $C_c$ is a carbon atom on the methylene chain that is separated by one carbon atom from the carbon atom $C_a$ to which $X^1$ is attached. The size of the hydrocarbon side chains is such that they are preferably $C_3$ to $C_{15}$ and more preferably $C_3$ to $C_{10}$. In the compounds of the general formulae (1ET) and (1ES), $R^1$ and $R^2$ each independently represents a hydrogen atom or a methoxy group, but both of them are not hydrogen atoms at the same time. Alternatively, $R^1$ and $R^2$ may combine together to form a ring through an alkylenedioxy group.

Preferred examples of the compounds of the general formula (1ET) include 2-nitrobenzyl 3-(trimethoxysilyl)propyl ether, 2-nitrobenzyl 6-(trimethoxysilyl)hexyl ether, 2-nitrobenzyl 10-(trimethoxysilyl)decyl ether, 4-methoxy-2-nitrobenzyl 3-(trimethoxysilyl)propyl ether, 4-methoxy-2-nitrobenzyl 6-(trimethoxysilyl)hexyl ether, 4-methoxy-2-nitrobenzyl 10-(trimethoxysilyl)decyl ether, 5-methoxy-2-nitrobenzyl 3-(trimethoxysilyl)propyl ether, 5-methoxy-2-nitrobenzyl 6-(trimethoxysilyl)hexyl ether, 5-methoxy-2-nitrobenzyl 10-(trimethoxysilyl)decyl ether, 4,5-dimethoxy-2-nitrobenzyl 3-(trimethoxysilyl)propyl ether, 4,5-dimethoxy-2-nitrobenzyl 6-(trimethoxysilyl)hexyl ether, 4,5-dimethoxy-2-nitrobenzyl 10-(trimethoxysilyl)decyl ether, 4,5-methylenedioxy-2-nitrobenzyl 3-(trimethoxysilyl) propyl ether, 4,5-methylenedioxy-2-nitrobenzyl 6-(trimethoxysilyl)hexyl ether and 4,5-methylenedioxy-2-nitrobenzyl 10-(trimethoxysilyl)decyl ether. More preferred examples thereof include 4,5-dimethoxy-2-nitrobenzyl 3-(trimethoxysilyl)propyl ether, 4,5-dimethoxy-2-nitrobenzyl 6-(trimethoxysilyl)hexyl ether, 4,5-dimethoxy-2-nitrobenzyl 10-(trimethoxysilyl)decyl ether, 4,5-methylenedioxy-2-nitrobenzyl 3-(trimethoxysilyl)propyl ether, 4,5-methylenedioxy-2-nitrobenzyl 6-(trimethoxysilyl)hexyl ether and 4,5-methylenedioxy-2-nitrobenzyl 10-(trimethoxysilyl)decyl ether.

In the compounds of the general formula (1ET), an example of a group in which $R^1$ and $R^2$ forms a ring is an alkylenedioxy group. Preferred examples thereof include 4,5-methylenedioxy-2-nitrobenzyl 3-(trimethoxysilyl)propyl ether, 4,5-methylenedioxy-2-nitrobenzyl 3-(triethoxysilyl)propyl ether, 4,5-methylenedioxy-2-nitrobenzyl 6-(trimethoxysilyl)hexyl ether, 4,5-methylenedioxy-2-nitrobenzyl 6-(triethoxysilyl)hexyl ether, 4,5-methylenedioxy-2-nitrobenzyl 10-(trimethoxysilyl)decyl ether, 4,5-methylenedioxy-2-nitrobenzyl 10-(triethoxysilyl) decyl ether and the like.

Preferred examples of the compounds of the general formula (2ET) include 3-(chlorodimethylsilyl)propyl 1-(2-nitrophenyl)ethyl ether, 3-(dichloromethylsilyl)propyl 1-(2-nitrophenyl)ethyl ether, 3-(trichlorosilyl)propyl 1-(2-nitrophenyl)ethyl ether, 6-(chlorodimethylsilyl)hexyl 1-(2-nitrophenyl)ethyl ether, 6-(dichloromethylsilyl)hexyl 1-(2-nitrophenyl)ethyl ether, 6-(trichlorosilyl)hexyl 1-(2-nitrophenyl)ethyl ether, 3-(chlorodimethylsilyl)propyl o-nitrobenzyl ether, 3-(dichloromethylsilyl)propyl o-nitrobenzyl ether, 3-(trichlorosilyl)propyl o-nitrobenzyl ether, 6-(chlorodimethylsilyl)hexyl o-nitrobenzyl ether, 6-(dichloromethylsilyl)hexyl o-nitrobenzyl ether, 6-(trichlorosilyl) hexyl o-nitrobenzyl ether, 3-(trimethoxysilyl)propyl 1-(2-nitrophenyl)ethyl ether, 3-(triethoxysilyl)propyl 1-(2-nitrophenyl)ethyl ether, 6-(trimethoxysilyl)hexyl 1-(2-nitrophenyl)ethyl ether, 6-(triethoxysilyl)hexyl 1-(2-nitrophenyl)ethyl ether, 3-(trimethoxysilyl)propyl o-nitrobenzyl ether, 3-(triethoxysilyl)propyl o-nitrobenzyl ether, 6-(trimethoxysilyl)hexyl o-nitrobenzyl ether and 6-(triethoxysilyl)propyl o-nitrobenzyl ether.

Especially preferred examples of the compounds of the general formula (1ES) include 1-(4,5-dimethoxy-2-nitrophenyl)methyl 5-(trimethoxysilyl)pentanoate, 1-(4,5-dimethoxy-2-nitrophenyl)methyl 5-(triethoxysilyl)pentanoate, 1-(4,5-dimethoxy-2-nitrophenyl)methyl 5-(trimethoxysilyl)undecanoate and 1-(4,5-dimethoxy-2-nitrophenyl)methyl 5-(triethoxysilyl)undecanoate.

Especially preferred examples of the compounds of the general formula (2ES) include 1-(2-nitrophenyl)ethyl 5-(chlorodimethylsilyl)pentanoate, 1-(2-nitrophenyl)ethyl 5-(dichloromethylsilyl)pentanoate, 1-(2-nitrophenyl)ethyl 5-(trichlorosilyl)pentanoate, 1-(2-nitrophenyl)ethyl 11-(chlorodimethylsilyl)undecanoate, 1-(2-nitrophenyl)ethyl 11-(dichloromethylsilyl)pentanoate, 1-(2-nitrophenyl)ethyl 11-(trichlorosilyl)undecanoate, o-nitrobenzyl 5-(chlorodimethylsilyl)pentanoate, o-nitrobenzyl 5-(dichloromethylsilyl) pentanoate, o-nitrobenzyl 5-(trichlorosilyl)pentanoate, o-nitrobenzyl 11-(chlorodimethylsilyl)undecanoate, o-nitrobenzyl 11-(dichloromethylsilyl)undecanoate, o-nitrobenzyl 11-(trichlorosilyl)undecanoate, 1-(2-nitrophenyl) ethyl 5-(trimethoxysilyl)pentanoate, 1-(2-nitrophenyl)ethyl 5-(triethoxysilyl)pentanoate, 1-(2-nitrophenyl)ethyl 11-(trimethoxysilyl)undecanoate, 1-(2-nitrophenyl)ethyl 11-(triethoxysilyl)undecanoate, o-nitrobenzyl 5-(trimethoxysilyl) pentanoate, o-nitrobenzyl 5-(triethoxysilyl)pentanoate, o-nitrobenzyl 11-(trimethoxysilyl)undecanoate and o-nitrobenzyl 11-(triethoxysilyl)undecanoate.

The compounds represented by the above general formulae (1ET), (1ES), (2ET) and (2ES) may be synthesized according to the processes described below.

One exemplary process for preparing the compounds of the general formulae (1ET) and (2ET) is shown below.

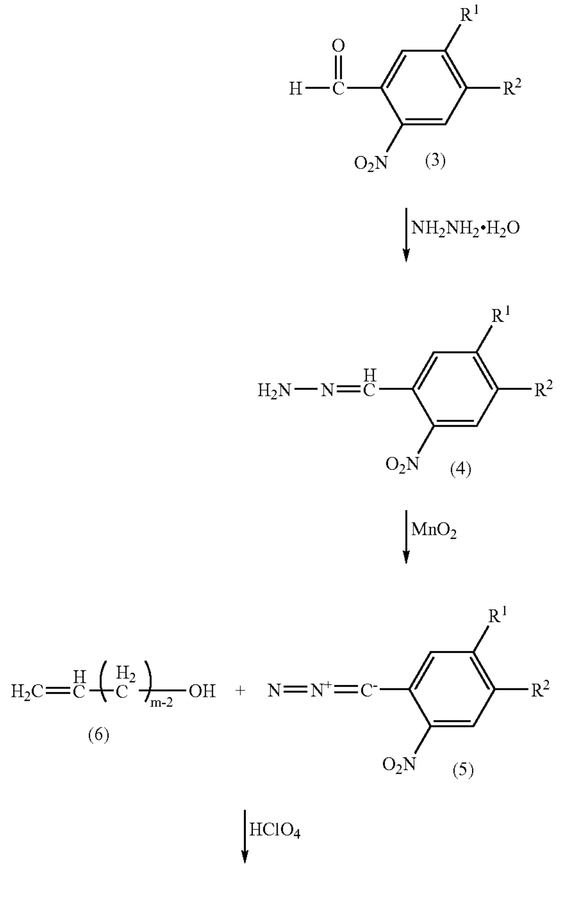

(3)
(4)
(6)
(5)

-continued

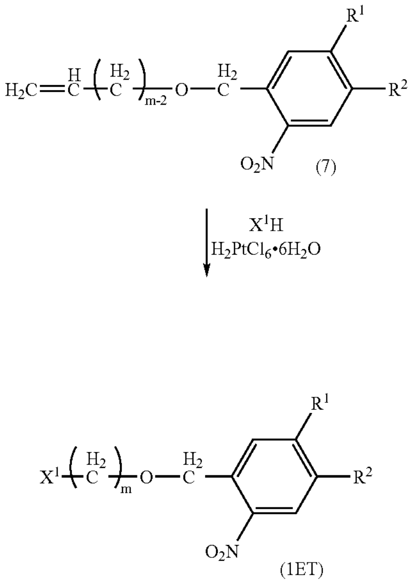

(7)

(1ET)

-continued

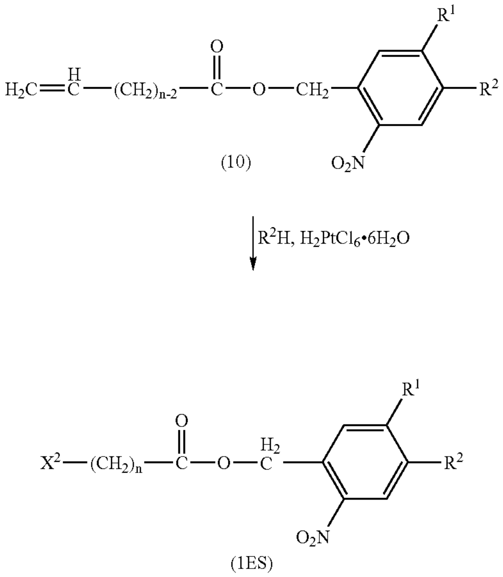

(10)

(1ES)

The compounds of the general formula (1ET) are obtained, for example, by reacting 2-nitrobenzaldehyde (3) having $R^1$ and $R^2$ at the 4- and 5-positions with hydrazine, oxidizing the reaction product with manganese dioxide to form a diazo compound (5), reacting it with an alcohol (6) having a double bond in the presence of perchloric acid to form an ether (7), and reacting the double bond of the ether (7) with trimethoxysilane or triethoxysilane under the catalytic action of hydrogen hexachloroplatinate(IV) hexahydrate ($H_2PtCl_6.6H_2O$). The compounds of the general formula (2ET) are also obtained in the same manner as above. In order to introduce a chlorodimethylsilyl, dichloromethylsilyl or trichlorosilyl group, the corresponding chlorodimethylsilane, dichloromethylsilane or trichlorosilane may be used.

The preparation of the compounds of the general formulae (1ET) and (2ET) is not limited to this process, but any other well-known processes may be employed. The compounds (1ET) and (2ET) in which $(CH_2)_m$ have hydrocarbon side chains may be synthesized by using a corresponding alcohol.

One exemplary process for preparing the compounds of the general formulae (1ES) and (2ES) is shown below.

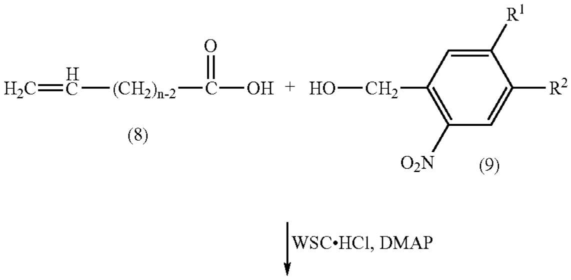

(8)

(9)

The compounds of the general formula (1ES) are obtained, for example, by reacting a carboxylic acid (8) having a double bond with an o-nitrobenzyl alcohol derivative (9) to form an ester (10), and reacting the double bond with a compound selected from trimethoxysilane, chlorodimethylsilane, dichloromethylsilane and trichlorosilane under the catalytic action of hydrogen hexachloroplatinate (IV) hexahydrate ($H_2PtCl_6.6H_2O$). The ester formation is carried out, for example, in the presence of WSC.HCl [WSC is an abbreviation for a water-soluble carbodiimide, and an example of WSC·HCl is 1-ethyl-3-(3-dimethylaminopropyl) carbodiimide hydrochloride] and DMAP (4-dimethylaminopyridine). The ester (10) may also be obtained by converting a carboxylic acid (8) having a double bond into an acid chloride according to a well-known method using thionyl chloride ($SOCl_2$) or the like, and reacting it with an o-nitrobenzyl alcohol derivative (9) in the presence of a tertiary amine such as DMAP.

The compound of the general formula (9) may be synthesized according to a well-known method, for example, by reducing the carbonyl group of a commercially available 2-nitrobenzaldehyde having alkoxy groups at the 4- and 5-positions with sodium boron hydride.

The compounds of the general formula (2ES) may also be synthesized in the same manner as above. In order to introduce a chlorodimethylsilyl, dichloromethylsilyl or trichlorosilyl group, the corresponding chlorodimethylsilane, dichloromethylsilane or trichlorosilane may be used.

The preparation of the ester compounds of the general formulae (1ES) and (2ES) is not limited to this process, but any other well-known processes may be employed. The compounds (1ES) and (2ES) in which $(CH_2)_n$ have a hydrocarbon side chain may be synthesized by using a corresponding alcohol.

The compounds represented by the above general formulae (2ET) and (2ES) may further be synthesized according to the process described in Japanese Patent Application Unexamined Publication No. 2002-80481 A.

With respect to the aforesaid resinous polymer having one or more phenolic hydroxyl groups, no particular limitation is placed on the positions at which the hydroxyl groups are present, and they may be portions of the side chains. In both cases, the weight-average molecular weight of the resinous polymer is preferably not less than 1,000 and more preferably in the range of 1,500 to 300,000.

Specifically, preferred resinous polymers include cresol-formaldehyde resins [for example, m-cresol-formaldehyde resin, p-cresol-formaldehyde resin, o-cresol-formaldehyde resin, a mixture of m-cresol-formaldehyde resin and p-cresol-formaldehyde resin, mixed phenol/cresol-formaldehyde resins (in which the cresol may be, for example, m-cresol, p-cresol, o-cresol, a mixture of m-cresol and p-cresol, or a mixture of m-cresol and o-cresol), etc.], resol type phenolic resins, pyrogallol-acetone resin, polyvinylphenol, a copolymer of vinylphenol and styrene, t-butyl-substituted polyvinylphenol resin, and the like.

The rate of introduction of a compound of the general formula (1ET), (1ES), (2ET) or (2ES) into the aforesaid resinous polymer is preferably from 5 to 100%. If the rate of introduction is less than 5%, the difference in solubility in the developing solution between exposed and unexposed regions (contrast) may become poor. The term "rate of introduction" means the proportion of hydroxyl groups combined with a compound of formula (1ET) or the like, to all hydroxyl groups possessed by the resinous polymer.

The acid-decomposable compounds which can be used in the present invention may be used alone or in admixture of two or more. The amount of acid-decomposable compound(s) is preferably from 1 to 60% by weight and more preferably from 1.5 to 60% by weight, based on the total solids of the photosensitive layer. If the amount added is less than 1% by weight, the difference in solubility in the developing solution between exposed and unexposed region (contrast) may become poor, while if it is greater than 60% by weight, the sensitivity may be reduced.

The acid generator used in the present invention is a compound which can generate an acid when the composition of the present invention is irradiated with near-infrared or infrared radiation. There may be used various well-known compounds commonly used as acid generators, and mixtures thereof. Preferred acid generators include, for example, the $BF_4^-$, $PF_6^-$, $SbF_6^-$, $SiF_6^{2-}$ and $ClO_4^-$ salts of diazonium, phosphonium, sulfonium and iodonium.

Other usable acid generators are organic halogen compounds. Organic halogen compounds are preferred from the viewpoint of the sensitivity of image formation by exposure to near-infrared and infrared radiation, and the shelf life of the image-forming composition. Among such organic halogen compounds, triazines having a halogen-substituted alkyl group and oxadiazoles having a halogen-substituted alkyl group are preferred, and s-triazines having a halogen-substituted alkyl group are especially preferred. Specific examples thereof include 2-(p-methoxyphenyl)-4,6-bis(trichloromethyl)-s-triazine, 2-(p-methoxynaphthyl)-4,6-bis(trichloromethyl)-s-triazine and 2-(p-methoxystyryl)-4,6-bis(trichloromethyl)-s-triazine.

In the present invention, the amount of the acid generator added is preferably from 0.1 to 20% by weight and more preferably from 0.2 to 10% by weight, based on the total solids of the photosensitive layer. If the amount added is less than 0.1% by weight, the sensitivity will be reduced, while if it is greater than 20% by weight, each component of the photosensitive layer will become hardly soluble in the solvent used for the dissolution thereof.

The infrared absorber contained in the photosensitive layer is a substance having a optothermal conversion function in which heat is produced by irradiation with near-infrared or infrared radiation (radiation preferably having wavelengths in the range of 700 to 2,500 nm and more preferably in the range of 700 to 1,300 nm). The infrared absorber is used to decompose the acid generator rapidly with the aid of heat produced thereby and facilitate the generation of an acid. The infrared absorbers which can be used in the present invention include infrared-absorbing dyes absorbing light at a wavelength of 700 nm or greater, carbon black, magnetic powders and the like. Especially preferred infrared absorbers are infrared-absorbing dyes having an absorption peak at a wavelength of 700 to 850 nm and a molar extinction coefficient ($\epsilon$) of not less than $10^5$ at the peak.

As the aforesaid infrared-absorbing dyes, cyanine dyes, squalium dyes, croconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes, intermolecular CT dyes and the like are preferred.

These dyes may be synthesized according to well-known methods. Alternatively, the following commercial products may also be used.

Nippon Kayaku Co., Ltd.: IR750 (anthraquinone dye), IR002, IR003 (aluminum dyes), IR820 (polymethine dye), IRG022, IRG033 (diimmonium dyes), CY-2, CY-4, CY-9, CY-10, CY-20.

Dainippon Ink and Chemicals, Incorporated: Fastogen blue 8120.

Midori Kagaku Co., Ltd.: MIR-101, 1011, 1021.

The aforesaid dyes are also sold by other suppliers including Nippon Kanko Shikiso Kenkyujo, Ltd., and Sumitomo Chemical Co., Ltd.

In the present invention the amount of infrared absorber added is preferably from 0.5 to 10% by weight and more preferably from 0.6 to 5.0% by weight, based on the total solids of the photosensitive layer. If the amount added is not less than 0.5% by weight, the sensitivity will be improved, while if it is not greater than 10% by weight, the development property of the non-image area (exposed region) will be improved.

It is desirable that the alkali-soluble resin used in the present invention has solubility and swellability in alkaline solutions. Such polymeric compounds include, for example, novolac resins, resole resins, polyvinyl phenol resins, copolymer of the acrylic acid and the like.

Novolac resins include, but not limited to, polycondensed mixtures in which at least one aromatic hydrocarbon such as phenol, o-cresol, m-cresol, p-cresol, 2,5-xylenol, 3,5-xylenol, resorcine, pyrogallol, bisphenol, bisphenol A, trisphenol, o-ethylphenol, m-ethylphenol, p-ethylphenol, propyl phenol, n-butyl phenol, t-butyl phenol, 1-naphthol, and 2-naphthol are polycondensed in the presence of an acid catalyst with an aldehyde such as formaldehyde, acetaldehyde, propionaldehyde, benzaldehyde, and furfural with a ketone such as acetone, methyl ethyl ketone, and methyl isobutyl ketone.

Paraformaldehyde and paraldehyde may be used respectively instead of formaldehyde and acetaldehyde. The weight-average molecular weight (hereafter "Mw") of the novolac resin, which is measured by gel permeation chromatography (GPC) based on a polystyrene standard, is preferably in the range of 1,000 to 15,000, and, in particular, the range of 1,500 to 10,000 is particularly preferable.

It is possible to use commercially available novolac resins such as, for example, PSF-2803, PSF-2807 (manufactured by Gunei Chemical industry Co., Ltd.), EP4020GS, EP5020G, EP6020G, (manufactured by Asahi Organic Chemicals Industry Co., Ltd), Hitanooru 1501 (manufactured by Hitachi Chemical Co., Ltd.), BRM-565 (manufactured by Showa Highpolymer), and RV-95, RT-95 (manufactured by Gifu Serakku).

The polyvinyl phenol resins include, but not limited to, hydroxystyrenes such as o-hydroxystyrene, m-hydroxystyrene, p-hydroxystyrene, 2-(o-hydroxyphenyl) propylene, 2-(m-hydroxyphenyl) propylene, and 2-(p-hydroxyphenyl) propylene individually or as polymers of two or more or these. Examples of hydroxystyrenes include those that have halogens such as chlorine, bromine, iodine, and fluorine in an aromatic ring, or a substituted group such as a $C_1$ to $C_4$ alkyl substituted group, which follows that polyvinyl phenols include polyvinyl phenols having a halogen in an aromatic ring or a $C_1$ to $C_4$ alkyl substituted group.

Polyvinyl phenol resins may be obtained by polymerizing one or more hydroxystyrenes which may ordinary have a substituted group(s) in the presence of a radical polymerization initiator or a cationic polymerization initiator. Such a polyvinyl phenol resin may be partially hydrogenated. Furthermore, the polyvinyl phenol resin may be one in which a portion of OH groups are protected by a t-butoxycarbonyl group, a pyranyl group, a furanyl group or the like. The Mw of the polyvinyl phenol resin that is used is preferably in the range of 1,000 to 80,000 and, in particular, preferably in the range of 1,500 to 50,000.

When the Mw of the above-described novolac resin or polyvinyl phenol resin is below the prescribed range, sufficient coating may not be obtained and print durability may deteriorate, and when it is above the prescribed range, the solubility of unexposed areas to alkaline developing solutions may deteriorate and may become a cause of soiling.

There is no particular limitation, but copolymers of acrylic acids can be obtained by copolymerizing monomers selected from the below-listed (m1) to (m10) using a conventionally known method such as graft copolymerization, block copolymerization, and random copolymerization.

(m1) Monomers having a phenolic hydroxyl group. They include, for example, N-(4-hydroxyphenyl)acrylamide, N-(4-hydroxyphenyl)methacrylamide, N-(4-hydroxyphenyl)methyl acrylamide, N-(3,5-dimethyl-4-hydroxyphenyl)methyl acrylamide, p-isopropenylphenol, o-hydroxyphenyl acrylate, m-hydroxyphenyl acrylate, p-hydroxyphenyl acrylate, o-hydroxyphenyl methacrylate, m-hydroxyphenyl methacrylate and p-hydroxyphenyl methacrylate.

(m2) Monomer having a sulfonamide group. For example, m-aminosulfonylphenyl methacrylate, N-(p-aminosulfonylphenyl) methacrylamide, N-(p-aminosulfonylphenyl) acrylamide.

(m3) Monomer having an active imide. For example, N-(p-toluenesulfonyl)methacrylamide, N-(p-toluenesulfonyl) acrylamide.

(m4) Monomers having an aliphatic hydroxyl group. They include, for example, 2-hydroxyethyl acrylate, 2-hydroxyethyl methacrylate, 2-hydroxy-3-phenoxypropyl acrylate and 2-hydroxy-3-phenoxypropyl methacrylate.

(m5) $\alpha,\beta$-unsaturated carboxylic acids. They include, for example, acrylic acid, methacrylic acid and maleic anhydride.

(m6) Monomers having an allyl group. They include, for example, allyl methacrylate and N-allylmethacrylamide.

(m7) Alkyl acrylates and alkyl methacrylates. They include, for example, methyl acrylate, ethyl acrylate, propyl acrylate, butyl acrylate, amyl acrylate, hexyl acrylate, octyl acrylate, lauryl acrylate, glycidyl acrylate, methyl methacrylate, ethyl methacrylate, propyl methacrylate, butyl methacrylate, amyl methacrylate, hexyl methacrylate, octyl methacrylate, lauryl methacrylate and glycidyl methacrylate.

(m8) Acrylamides and methacrylamides. They include, for example, acrylamide, N-methylolacrylamide, N-ethylacrylamide, N-hexylacrylamide, N-cyclohexylacrylamide, N-hydroxyethylacrylamide, N-phenylacrylamide, methacrylamide, N-methylolmethacrylamide, N-ethylmethacrylamide, N-hexylmethacrylamide, N-cyclohexylmethacrylamide, N-hydroxyethylmethacrylamide and N-phenylmethacrylamide.

(m9) Styrenes. They include, for example, styrene, $\alpha$-methylstyrene and chloromethylstyrene.

(m10) N-Vinylpyrrolidone, N-vinylcarbazole, 4-vinylpyridine, acrylonitrile, methacrylonitrile and the like.

The Mw of the copolymer of the acrylic acid to be used is preferably in the range of 1,000 to 500,000, and, in particular, preferably in the range of 1,500 to 300,000. When the Mw is lower than the prescribed range, sufficient coating may not be obtained, and when it is higher than the prescribed range, the solubility of unexposed areas to alkaline developing solutions may deteriorate and make development impossible.

In the present invention, the aforesaid alkali-soluble resins may be used alone or in admixture of two or more. They are preferably added in an amount of 20 to 98% by weight and more preferably 25 to 95% by weight, based on the photosensitive layer. When the amount added is not less than 20% by weight, the printing durability is improved, while when it is not greater than 98% by weight, the sensitivity is improved.

In the alkali-soluble resin used in the present invention, it is more preferable from the viewpoint of latitude of development to use a mixture of a novolak resin and an alkali-soluble acrylic copolymer as described above. The amount of acrylic copolymer added is preferably from 5 to 40% by weight and more preferably from 6 to 35% by weight, based on the novolak resin. If the amount added is less than 5% by weight, the latitude of development may become poor, while if it is greater than 40% by weight, the printing durability may be reduced.

In order to color the photosensitive layer of the present invention, dyes may be added thereto. As such dyes, oil-soluble dyes and basic dyes are preferred. Specifically, Crystal Violet, Malachite Green, Victoria Blue, Methylene Blue, Ethyl Violet, Rhodamine B, Victoria Pure Blue BOH (manufactured by Hodogaya Chemical Co., Ltd.), Oil Blue 613 (manufactured by Orient Chemical Industries, Ltd.), Oil Green and the like are preferred. These dyes are preferably added in an amount of 0.05 to 5.0% by weight and more preferably 0.1 to 4.0% by weight, based on the total solids of the photosensitive layer. When the amount added is not less than 0.05% by weight, the image-forming layer becomes sufficiently colored to make the images clearly visible, while when it is not greater than 5.0% by weight, it is preferred that the dye(s) will not tend to remain in the non-image area after development.

In addition to the above-mentioned elements, an oil-sensitive resin, a sensitivity enhancing agent, a dissolution inhibitor, a surface active agent, or a plasticizer may be further added as required to the photosensitive layer of the present invention to the extent that doing so does not harm the effect of the present invention.

As the aforesaid oil-sensitive resin, there may be used, for example, a condensation product formed from a phenol substituted with one or more alkyl groups of $C_3$ to $C_{15}$ and an aldehyde, as described in Japanese Patent Application Unexamined Publication No. S50-125806/1975 A; or a t-butylphenol-formaldehyde resin.

Examples of sensitivity enhancing agents include cyclic acid anhydrides, phenols, organic acids, leuco pigments, and phthalimide compounds. Examples of cyclic acid anhydrides that can be used include phthalic anhydride, tetrahydro phthalic anhydride, hexahydro phthalic anhydride, tetrachloro phthalic anhydride, maleic anhydride, chloro maleic anhydride, succinic acid anhydride, and pyromellitic acid anhydride.

Moreover, in order to enhance its sensitivity, the image-forming composition of the present invention may further comprise a phenol, an organic acid or a leucopigment as required. Preferred phenols includes bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane and the like.

Preferred organic acids include sulfonic acids, sulfinic acids, alkylsulfuric acids, phosphonic acids, phosphoric esters, carboxylic acids and the like, as described in Japanese Patent Application Unexamined Publication No. S60-88942/1985 A, Japanese Patent Application Unexamined Publication No. H2-96755/1990 A and the like. Specifically, they include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, toluylic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid and the like.

Preferred leucopigments include 3,3-bis(4-dimethylaminophenyl)-6-dimethylaminophthalide, 3-(4-diethylamino-2-ethoxyphenyl)-3-(1-ethyl-2-methylindol-3-yl)-4-azaphthalide, 3-(4-diethylaminophenyl)-3-(1-ethyl-2-methylindol-3-yl)phthalide, 3,3-bis(4-diethylamino-2-ethoxyphenyl)-4-azaphthalide, 3,6,6'-tris(dimethylamino)spiro[fluorene-9,3'-phthalide], 3,3-bis(1-n-butyl-2-methylindol-3-yl)phthalide and the like.

Phthalimide compounds include, but not limited to, phthalimide, 4-methylphtalimide, 4-chloro methylphtalimide, 3-nitro phthalimide, 4-phenyl phthalimide, and 3-amide phthalimide.

It is preferable that the proportion occupied by phenols, organic acids, leuco pigments, and phthalimide compounds in the photosensitive layer is in the range of 0.05 to 20.0 wt %, or more preferably 0.1 to 15.0 wt %, or particularly preferably 0.1 to 10.0 wt %. When it is not more than 20.0 wt %, the risk of excessive dissolution in the developing liquid is lessened, and the risk of the solid image portions becoming thin is lessened, that is, development latitude is much improved, which is preferable.

Examples of dissolution inhibitors include high molecular novolac resins and resol resins of a molecular weight not less than 10,000 and polyethylene glycol of a molecular weight in the range of 200 to 6,000. It should be noted that molecular weight, unless specified in particular otherwise, indicates weight-average molecular weight in the present specification, which refers to the weight-average molecular weight convert to polystyrene as measured by gel permeation chromatography (GPC).

The amount of added dissolution inhibitors is preferably in the range of 0.05 to 10.0 wt % of the photosensitive layer, or more preferably in the range of 0.1 to 8.0 wt %. When it is not less than 0.05 wt %, the anti-abrasiveness effect is much improved, and when it is not more than 10.0 wt %, it becomes easier to dissolve and easier to develop, which is preferable.

Furthermore, in order to expand its treating stability to developing conditions, a nonionic surface-active agent as described in Japanese Patent Application Unexamined Publication Nos. S62-251740/1987 A and H3-208514/1991 A, or an amphoteric surface-active agent as described in Japanese Patent Application Unexamined Publication Nos. S59-121044/1984 A and H4-13149/1992 A may be added to the photosensitive layer of the present invention. Suitable examples of the nonionic surface-active agent include sorbitan tristearate, sorbitan monopalmitate, sorbitan trioleate, stearic acid monoglyceride, polyoxyethylene nonylphenyl ether, polyoxyethylene oleyl ether (such as "emulgen 404" Kao Corporation) and the like. Suitable examples of the amphoteric surface-active agent include alkyldi(aminoethyl) glycine, alkylpolyaminoethylglycine hydrochloride, 2-alkyl-N-carboxyethyl-N-hydroxyethylimidazolinium betaine, N-tetradecyl-N,N-betaine type surface-active agents (e.g., the one commercially available from Dai-ichi Kogyo Seiyaku Co., Ltd. under the trade name of "Amogen K") and the like. The aforesaid nonionic surface-active agent or amphoteric surface-active agent is preferably present in an amount of 0.05 to 15% by weight and more preferably 0.1 to 15% by weight, based on the total solids of the photosensitive layer.

It is also possible to add plasticizers to the photosensitive layer of the present invention in order to provide qualities of flexibility and the like to the coating. Examples of these that may be used include butyl phthalyl, polyethylene glycol, tributyl citric acid, diethyl phthalate, dibutyl phthalate, dihexyl phthalate, dioctyl phthalate, trichlene phosphoric acid, trioctyl phosphoric acid, and tributyl phosphoric acid.

There is no particular limitation, a base plate for a photosensitive lithographic printing plate can be obtained by applying sensitizing solution with above components in solution onto a surface-treated aluminum plate to form photosensitive layer. The aforesaid solvent include, but not limited to, methanol, ethanol, propanol, methylene chloride, ethyl acetate, tetrahydrofuran, propylene glycol monomethyl ether, propylene glycol monoethyl ether, methyl cellosolve, ethyl cellosolve, methyl cellosolve acetate, ethyl cellosolve acetate, dimethylformamide, dimethyl sulfoxide, dioxane, dioxolane, acetone, cyclohexanone, trichloroethylene and methyl ethyl ketone. These solvents may be used alone or in admixture of two or more. The concentration of the above component (the total solids comprising additives) is preferably from 1 to 50% by weight.

The method for applying the solvent may be carried out in various ways, for example, spin coating, extrusion coating, bar coater coating, roll coating, air knife coating, dip coating and curtain coating. The amount of the photosensitive layer applied is preferably from 0.5 to 5.0 g/m$^2$ on a solid basis, though it may vary with the end use.

The drying treatment is carried out at preferably 30–180° C. and more preferably 50–140° C. The drying treatment is carried out for preferably ten seconds to two hours. In addition, it is preferable to age the base plate for a lithographic printing plate obtained by drying the aluminum support. Aging treatment can be carried out at the temperature of preferably 30–100° C. for preferably 1–168 hr, more preferably 3–96 hr. The aging treatment makes the bond tight between the acid-decomposable compound obtainable by the addition reaction of a resinous polymer-having one or more phenolic hydroxyl groups with a silane coupling agent of the following general formula (1) or (2), and the alkali-soluble resin, resulting in the improvement of chemical resistance and print durability of the obtained plate.

The photosensitive layer coated on the base plate for a lithographic printing plate may be further provided with a matte layer on its surface. This improves the ability of the plate to separate from other plates when many base plates for lithographic printing plates are stacked without slip sheets, and also improves the ability of the plate to separate from slip sheets when plates are stacked with slip sheets in between.

Furthermore, a matting agent may be included in the photosensitive layer for the object of improving the separation properties between plates as described above, as well as the separation properties between the plate and slip sheets.

When a positive type photosensitive layer for infrared lasers is used, it is preferable that the laser light source for irradiating the base plate for lithographic printing plates of the present invention is a light source that has an emitted light wavelength in the range of near-infrared to infrared, with solid state lasers and semiconductor lasers being preferable. An emitted light wavelength in the range of 760 to 850 nm is preferable.

As the developing solution which can be used to develop the base plate for a lithographic printing plate of the present invention, an aqueous alkaline developing solution is preferred. Examples of the aqueous alkaline developing solution include aqueous solutions of alkali metal salts such as sodium hydroxide, potassium hydroxide, sodium carbonate, potassium carbonate, sodium metasilicate, potassium metasilicate, sodium secondary phosphate and sodium tertiary phosphate.

Moreover, an activator may be added to the aforesaid aqueous alkaline solutions. As the aforesaid activator, there may be used an anionic surface-active agent or an amphoteric surface-active agent may be used.

Usable examples of the aforesaid anionic surface-active agent include sulfuric esters of alcohols of $C_8$ to $C_{22}$ (e.g., polyoxyethylene alkylsulfate sodium salt), alkylarylsulfonic acid salts (e.g., sodium dodecylbenzenesulfonate, polyoxyethylene dodecylphenylsulfate sodium salt, sodium alkylnaphthalenesulfonate, sodium naphthalenesulfonate, and formalin condensate of sodium naphthalenesulfonate), sodium dialkylsulfoxylates, alkyl ether phosphoric esters and alkyl phosphates. Preferred examples of the amphoteric surface-active agent include alkylbetaine type and alkylimidazoline type surface-active agents. Furthermore, a water-soluble sulfurous acid salt such as sodium sulfite, potassium sulfite, lithium sulfite or magnesium sulfite may also be added to the aforesaid aqueous alkaline solutions.

EXAMPLE

The present invention is further illustrated by the following examples. However, these examples are not to be construed to limit the scope of the invention.

Examples 1 to 3

After thorough degreasing was performed on a 0.24 mm thick aluminum plate, the surface of the plate was polished using a nylon brush with an aqueous suspension of pumice stone and then rinsed well. After etching the plate by immersing it in a 15 wt % aqueous solution of sodium hydroxide for 10 seconds at 70° C., the plate was rinsed with running water. The plate underwent electrolytic surface roughening in a 1N hydrochloric acid solution at 200 coulomb/$dm^2$. After further rinsing, etching was again performed on the surface with a 15 wt % aqueous solution of sodium hydroxide and, after rinsing, the plate was immersed in a 20 wt % aqueous solution of sulfuric acid, then de-smutted. Next, anodization was performed in a 15 wt % aqueous solution of sulfuric acid and a 2.0 g/$m^2$ oxidation coating was formed on the surface. After rinsing, treatment was performed for approximately 15 seconds while supplying a treatment liquid at a treatment temperature, both of which are listed in Table 1 below, with a shower nozzle system. After rinsing and drying, the aluminum plate support was thus prepared. It should be noted that aluminum supports were prepared in the same way, but without using these treatments, for the purpose of comparison. Furthermore, the size of the particles formed on the surface was examined with an electron microscope at 10,000 times magnification, and the results of this are shown in Table 1 below.

TABLE 1

| | | Treatment liquid | treatment temperature | Mean particle size |
|---|---|---|---|---|
| Example 1 | treatment 1 | 0.5 wt % sodium fluoride<br>5.0 wt % sodium dihydrogenphosphate<br>0.5 wt % ammonium perchlorate | 70° C. | 0.1 μm |
| Example 2 | treatment 2 | 1.0 wt % potassium hydrogen fluoride<br>10.0 wt % sodium dihydrogenphosphate<br>0.5 wt % sodium perchlorate | 50° C. | 0.4 μm |
| Example 3 | treatment 3 | 3.0 wt % sodium fluoride<br>10.0 wt % sodium dihydrogenphosphate<br>0.3 wt % sodium perchlorate | 70° C. | 0.08 μm |

Lithographic printing plates were prepared in which a photosensitive layer was provided applied on the thus-treated substrates by applying a photosensitive liquid of a constitution described below so that the applied weight after drying was 2.0 g/$m^2$. The drying treatment was carried out at 100° C. for 10 minutes.

(Photosensitive Liquid 1)

Acid-decomposable compound A (0.215 g)

Photoacid generators: 2-(p-methoxyphenyl)-4, 6-bis(trichloromethyl)-s-triazine (0.021 g)

Infrared light absorbing agent: cyanine compound A listed below (0.072 g)

Alkali soluble resin: Novolac resin (PSF-2803) (manufactured by Gunei Chemical Industry Co., Ltd.) (2.0 g), Novolac resin (PSF-2807) (manufactured by Gunei Chemical Industry Co., Ltd.) (1.15 g), acrylic copolymer a (1.0 g)

Nonionic surface active agent: Emulgen 404 (manufactured by Kao Corporation) (0.1 g)

Dye: oil blue 613 (manufactured by Orient Chemical Industries, Ltd) (0.1 g)

Solvent: propylene glycol monomethyl ether/methyl cellosolve acetate=45 ml/5 ml

Cyanine compound A

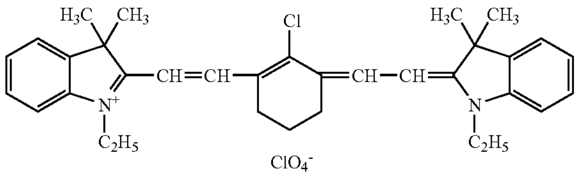

Above-mentioned acid-decomposable compound A was prepared as follows. Maruka Linker CST70 (vinylphenol: styrene=7:3) (manufactured by Maruzen Petrochemical Co., Ltd.) (0.215 g) as a resinous polymer containing phenolic hydroxyl groups, and 2-nitrobenzyl 6-(trimethoxysilyl) hexyl ether (0.45 g; 100% theoretical introduction rate) as a silane coupling agent were mixed in hexane (6 ml) and heated at 70° C. for 1 hour with stirring. Thereafter, the hexane was distilled off to obtain an acid-decomposable compound A. In its IR spectrum, a new peak attributable to —Si—O— appeared. Thus, it was confirmed that the desired reaction had been effected. The term "100% theoretical introduction rate" means that the amount of the silane coupling agent is stoichiometrically equivalent to the hydroxyl groups possessed by the polymer.

Above-mentioned acrylic copolymer a was prepared as follows. A 500-ml four-neck flask fitted with a stirrer and a cooling pipe was charged with reagent A [18.7 g of N-(p-hydroxyphenyl)maleimide, 17.2 g of acrylonitrile, 5 g of methyl methacrylate, 6.5 g of 2-hydroxyethyl methacrylate and 108 g of dimethylacetamide] and purged with nitrogen for about 20 minutes. Then, after the flask was heated to 73° C. in an oil bath, reagent B [0.25 g of 2,2'-azobis(2-methylbutyronitrile)] was added thereto and the resulting reaction mixture was stirred for 2 hours. Furthermore, reagent C [a mixture of 18.7 g of N-(p-hydroxyphenyl) maleimide, 17.2 g of acrylonitrile, 5 g of methyl methacrylate, 6.5 g of 2-hydroxyethyl methacrylate and 108 g of dimethylacetamide, and 0.25 g of 2,2'-azobis(2-methylbutyronitrile)] was added dropwise thereto through a dropping funnel over a period of 2 hours. After completion of the addition, the stirring was continued at 73° C. for an additional 2 hours to obtain an alkali-soluble acrylic copolymer a having a concentration of 30% by weight.

Example 4

A lithographic printing plate was prepared by applying the below-listed photosensitive liquid 2 to an aluminum plate that had undergone treatment 3 of the present invention. The drying treatment was carried out at 100° C. for 10 minutes.

(Photosensitive Liquid 2)

Thermal decomposition compound: dipheny iodonium hexafluorophosphate (0.215 g)

Photoacid generators: 2-(p-methoxyphenyl)-4, 6-bis(trichloromethyl)-s-triazine (0.021 g)

Infrared light absorbing agent: cyanine compound A listed below (0.072 g)

Alkali soluble resin: Novolac resin (PSF-2803) (manufactured by Gunei Chemical Industry Co., Ltd.) (2.0 g), Novolac resin (PSF-2807) (manufactured by Gunei Chemical Industry Co., Ltd.)

Dye: oil blue 613 (manufactured by Orient Chemical Industries, Ltd) (0.1 g)

Solvent: propylene glycol monomethyl ether/methyl cellosolve acetate=45 ml/5 ml

Example 5

The lithographic printing plate prepared in Example 3 was further kept for aging at 50° C. for 48 hr.

Comparative Example 1

For the purpose of comparison, a lithographic printing plate was prepared by applying the photosensitive liquid 1 to an aluminum plate that was treated (treatment 4) in the same manner as Example 1 using the treatment liquids of treatment 3 in the present invention, but excluding sodium perchlorate.

Comparative Example 2

For the purpose of comparison, a lithographic printing plate was prepared by applying the photosensitive liquid 1 to an aluminum plate that did not undergo the treatment of the present invention.

Performance evaluations were carried out as follows on the lithographic printing plates of Examples 1 to 4 and Comparative Examples 1 and 2, which were prepared as described above.

Evaluation of Sensitivity

The printing plates were exposed using a semiconductor laser with a wavelength of 830 nm (a TrendSetter 400 QTM manufactured by Creo Inc.) with the amount of exposure being varied in stages. The plates were developed in an automatic developing device (PK-910) using a liquid (electric conductivity 53 mS/cm) that was a 1:12 dilution of developing liquid TD-4 for thermal plates manufactured by Okamoto Chemical Company diluted 1:12 with a liquid temperature of 30° C. and a developing time of 20 seconds. The minimum exposure value required to completely remove the image was evaluated as the sensitivity. The results are shown in Table 2 below.

Evaluation of Blanket Soiling

Printing was carried out with printing plates exposed and developed as described above using tap water as dampening solution and offset inks (F Gloss Black manufactured by Dainippon Ink And Chemicals, Incorporated). After printing approximately 5,000 sheets using high quality paper, the printing press was stopped once and left for one hour, after which printing was resumed and another 5,000 sheets were printed, at which time blanket and press sheet soiling conditions were visually examined. The results are shown in Table 2 below. The evaluation criteria were as follows. A: No blanket or press sheet soiling evident. B: Slight soiling produced on blanket, but no soiling evident on press sheets. C: Blanket blackened by transfer of ink and slight soiling evident on press sheets.

Evaluation of Chemical Resistance

Printing plates exposed and developed as described above were immersed in Prisco dampening solution, which is a mixture of 3 ounces of Prisco 3451U and 1.5 ounces of Alkaless A6000 in one gallon of water, and the time taken until 3% halftone dots were lost was measured. The results are shown in Table 2 below.

Evaluation of Print Durability

Printing was carried out using printing plates exposed and developed as described above using the above-mentioned Prisco dampening solution with offset inks on coated stock, and the number of sheets printed before 3% halftone dots were lost was counted. The results are shown in Table 2 below.

TABLE 2

| | Process | Photosensitive liquid | Sensitivity (mj/cm$^2$) | Blanket soiling | Chemical resistance | Print durability |
|---|---|---|---|---|---|---|
| Example 1 | Process 1 | Photosensitive liquid 1 | 90 | A | 20 hours without loss | 120,000 |
| Example 2 | Process 2 | Photosensitive liquid 1 | 90 | A | 20 hours without loss | 120,000 |
| Example 3 | Process 3 | Photosensitive liquid 1 | 80 | A | 20 hours without loss | 100,000 |
| Example 4 | Process 3 | Photosensitive liquid 2 | 100 | A | Lost after 15 hours | 50,000 |
| Example 5 | Process 3 | Photosensitive liquid 1 | 90 | A | 20 hours without loss | 150,000 |
| Comparative example 1 | Process 4 | Photosensitive liquid 1 | 90 | B | Lost after 8 hours | 20,000 |
| Comparative example 2 | None | Photosensitive liquid 1 | 110 | C | 20 hours without loss | 100,000 |

Evaluation of Development Removal Properties

The entire surface of the above-described printing plates were exposed using the above-mentioned semiconductor laser with an exposure amount of 130 mj/cm$^2$, then immersed for 12 seconds in a 1:16 dilution (electric conductivity 45 mS/cm) of the above-mentioned developing liquid (liquid temperature 30° C.), then rinsed and dried, after which the entire surface of the plate was inked and left for 15 minutes, after which ink removal was performed with running water. The soiling conditions of the plates were viewed at this time and evaluated as development removal properties. The results are shown in Table 3 below. The evaluation criteria were as follows. A: Ink completely and easily removed, no soiling. B: Ink had become difficult to remove, but no soiling. C: Ink had sunk into plate surface and could not be removed, resulting in soiling.

TABLE 3

| | development removal properties |
|---|---|
| Example 1 | A |
| Example 2 | A |
| Example 3 | A |
| Example 4 | B |
| Example 5 | A |
| Comparative Example 1 | B |
| Comparative Example 2 | C |

As can be seen in Tables 2 and 3, a base plate for a lithographic printing plate according to the present invention provides a base printing plate for infrared lasers, the plates having fast sensitivity, good development removal properties, with no soiling in non-image areas and no blanket soiling during printing, and, moreover, superior chemical resistance and print durability in image areas.

What is claimed is:

1. A base plate for a lithographic printing plate, the base plate comprising a aluminum support, and a photosensitive layer for infrared laser on the aluminum support, wherein the photosensitive layer comprises:

(A) an acid-decomposable compound obtainable by the addition reaction of a resinous polymer having one or more phenolic hydroxyl groups with a silane coupling agent of the following general formula (1) or (2), (1)

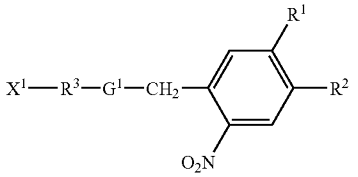

(2)

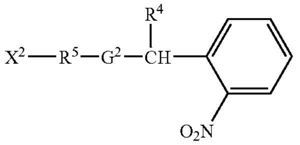

wherein $X^1$ represents a trimethoxysilyl or triethoxysilyl group; $G^1$ represents O or COO; $R^1$ and $R^2$ each independently represents a hydrogen atom or a methoxy group, but both of them are not hydrogen atoms at the same time; $R^1$ and $R^2$ may also be combined together to form a ring through an alkylenedioxy group; $R^3$ represents $(CH_2)_m$, which may have a hydrocarbon side chain, wherein m is an integer of 3 or greater; $X^2$ represents a trimethoxysilyl, triethoxysilyl, chiorodimethylsilyl, dichloromethylsilyl or trichlorosilyl group; $G^2$ represents O or COO; $R^4$ represents a hydrogen atom or a straight-chain or branched alkyl group; and $R^5$ represents $(CH_2)_n$ which may have a hydrocarbon side chain, wherein n is an integer of 3 or greater;

(B) an acid generator;

(C) an infrared absorber; and (D) an alkali-soluble resin, wherein the aluminum support comprises an anodized aluminum plate and particles formed by treating a surface of the anodized aluminum plate with a treatment liquid comprising at least one metal fluoride compound, at least one metal phosphate salt, and at least one perchlorate.

2. The base plate of claim 1, wherein the particles have a mean particle size not greater than 1 μm.

3. A method for preparing a base plate for a lithographic printing plate, comprising:

treating a surface of an anodized aluminum plate with a treatment liquid comprising at least one metal fluoride compound, at least one metal phosphate salt, and at least one perchlorate to form particles on said surface and to obtain an aluminum support;

applying sensitizing solution on the aluminum support, the sensitizing solution comprising (A) an acid-decomposable compound obtainable by the addition reaction of a resinous polymer having one or more phenolic hydroxyl groups with a silane coupling agent of the following general formula (1) or (2), (1)

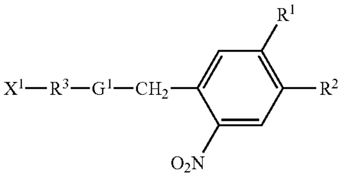

(2)

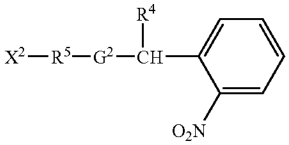

wherein $X^1$ represents a trimethoxysilyl or triethoxysilyl group; $G^1$ represents O or COO; $R^1$ and $R^2$ each independently represents a hydrogen atom or a methoxy group, but both of them are not hydrogen atoms at the same time; $R^1$ and $R^2$ may also be combined together to form a ring through an alkylenedioxy group; $R^3$ represents $(CH_2)_m$ which may have a hydrocarbon side chain, wherein m is an integer of 3 or greater; $X^2$ represents a trimethoxysilyl, triethoxysilyl, chiorodimethylsilyl, dichloromethylsilyl or trichlorosilyl group; $G^2$ represents O or COO; $R^4$ represents a hydrogen atom or a straight-chain or branched alkyl group; and $R^5$ represents $(CH_2)_n$ which may have a hydrocarbon side chain, wherein n is an integer of 3 or greater;

(B) an acid generator, (C) an infrared absorber; and (D) an alkali-soluble resin; and drying the aluminum support on which the sensitizing solution applied.

4. The method according to claim 3, further comprising aging the base plate for a lithographic printing plate obtained by drying the aluminum support.

* * * * *

UNITED STATES PATENT AND TRADEMARK OFFICE
CERTIFICATE OF CORRECTION

PATENT NO. : 7,217,499 B2
APPLICATION NO. : 11/017102
DATED : May 15, 2007
INVENTOR(S) : Jun Ozaki and Yasuhiro Uozumi It is certified that error appears in the above-identified patent and that said Letters Patent is hereby corrected as shown below:

Col. 25, claim 1, line 61 “comprising a aluminum” should be --comprising an aluminum--.

Col. 26, claim 1, line 50, “chiorodimethylsilyl” should be --chlorodimethylsilyl--.

Col. 28, claim 3, line 9, “chiorodimethylsilyl” should be --chlorodimethylsilyl--.

Col. 28, claim 3, line 17, “solution applied” should be --solution is applied--.

Signed and Sealed this

Second Day of September, 2008

JON W. DUDAS
*Director of the United States Patent and Trademark Office*